US009122528B2

(12) United States Patent (10) Patent No.: US 9,122,528 B2
Haydock et al. (45) Date of Patent: Sep. 1, 2015

(54) ENERGY CONSERVATION AND HARDWARE USAGE MANAGEMENT FOR DATA CENTERS

(71) Applicant: TELEFONAKTIEBOLAGET L M ERICSSON (PUBL), Stockholm (SE)

(72) Inventors: Lawrence Haydock, Town Mount Royal (CA); Zhongwen Zhu, Town Mount Royal (CA); Nazin Hossain, Town Mount Royal (CA)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 185 days.

(21) Appl. No.: 13/713,854

(22) Filed: Dec. 13, 2012

(65) Prior Publication Data

US 2014/0173612 A1 Jun. 19, 2014

(51) Int. Cl.
  *G06F 9/50* (2006.01)
  *G06F 1/20* (2006.01)
  *G06F 1/32* (2006.01)
  *H05K 7/14* (2006.01)

(52) U.S. Cl.
  CPC *G06F 9/50* (2013.01); *G06F 1/206* (2013.01); *G06F 1/3206* (2013.01); *G06F 1/3287* (2013.01); *G06F 9/5088* (2013.01); *G06F 9/5094* (2013.01); *H05K 7/1498* (2013.01); *Y02B 60/1275* (2013.01); *Y02B 60/1282* (2013.01); *Y02B 60/142* (2013.01); *Y02B 60/162* (2013.01)

(58) Field of Classification Search
  None
  See application file for complete search history.

(56) References Cited

U.S. PATENT DOCUMENTS

| 7,756,972 B2 | 7/2010 | Ma |
| 2006/0112286 A1 | 5/2006 | Whalley et al. |
| 2009/0228893 A1 | 9/2009 | Behrendt et al. |
| 2009/0265568 A1 * | 10/2009 | Jackson ......................... 713/320 |
| 2011/0126206 A1 | 5/2011 | Kato et al. |
| 2011/0213886 A1 * | 9/2011 | Kelkar et al. ................. 709/226 |
| 2012/0116595 A1 | 5/2012 | Mizuno et al. |
| 2012/0137002 A1 | 5/2012 | Ferris et al. |

FOREIGN PATENT DOCUMENTS

WO WO-2009/137028 11/2009

OTHER PUBLICATIONS

PCT Search Report; Written Opinion; International Application No. PCT/IB2013/060938; International filing date Dec. 13, 2013; mailing date Apr. 16, 2014.
"Elements of Data Center Efficiency", *Data Center Efficiency Metrics and Methods*; http://viewer.media.bitpipe.com/979246117_954/1279665297; 20 pages.
Gandhi, Anshul, et al., "Optimal Power Allocation in Server Farms", *School of Computer Science*, Mar. 2009; CMU-CS-09-113.
Gandhi, Anshul, et al., "Optimality Analysis of Energy-Performance Trade-off for Server Farm Management", *Elsevier; ScienceDirect; Performance Evaluation* 00.(2010) 1-23.
Harchol-Balter, Mor, "Power Management in Data Centers", *Associate Department Head, Computer Science Department, Carnegie Mellon University*, 3 pages.

* cited by examiner

*Primary Examiner* — Emerson Puente
*Assistant Examiner* — Jonathan R Labud
(74) *Attorney, Agent, or Firm* — Nicholson de Vos Webster & Elliott, LLP

(57) ABSTRACT

A power management and data center resource monitoring mechanism is provided for selecting new processing elements in a data center. When a condition is detected for selecting new processing elements, one or more processing elements are selected as the new processing elements based on at least a temperature parameter and a usage history parameter of at least some of the processing elements in the data center. Workload is consolidated onto the new processing elements to conserve energy.

19 Claims, 5 Drawing Sheets

ENERGY CONSERVATION AND HARDWARE USAGE MANAGEMENT FOR DATA CENTERS

TECHNICAL FIELD

Embodiments of the invention relate to data center power management; and more specifically, to management of power and hardware usage in a data center.

BACKGROUND

Data centers are facilities that house computing and/or telecommunication equipment. Data centers are often used by cloud computing providers to provide computing resources to users based on a pay-as-you-go business model. Cloud computing provides scale-out and scale-in capabilities for applications such that any application can request additional resources when necessary, and release resources when the allocated resources exceed its demand. Thus, at any given time cloud computing resources are dynamically allocated to an application based on the demand of the application.

The hardware in a data center may be virtualized by virtualization software to improve hardware efficiency and utilization. A virtualized processor can run multiple virtual machines (VMs). Each VM is created and managed by a hypervisor (also referred to as a virtual machine monitor). An application that runs in the cloud computing environment may request and release VMs on demand. The hardware (e.g., servers or blades) hosting the VMs may be located close together in a data center, or distributed throughout one or more data centers. At any given time, on any active blade or server, multiple VMs may be running simultaneously serving unrelated applications.

Data centers generally incur a high operating cost. During operation, hardware equipment consumes a large amount of power, which in turn dissipates heat that requires cooling. Electricity for powering up and cooling down the data center infrastructure is expensive.

Data centers also incur high capital expenditure on hardware equipment. As the hardware has a mean time to failure, not using all the hardware equally can result in some hardware needing to be replaced frequently for being worn out, and some hardware only being lightly used but eventually being replaced due to obsolescence before reaching the end of its useful life. Overall this results in increased capital expenditure, and more hardware in landfills than if the usage of the hardware had been optimized.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

SUMMARY

Figure 1:
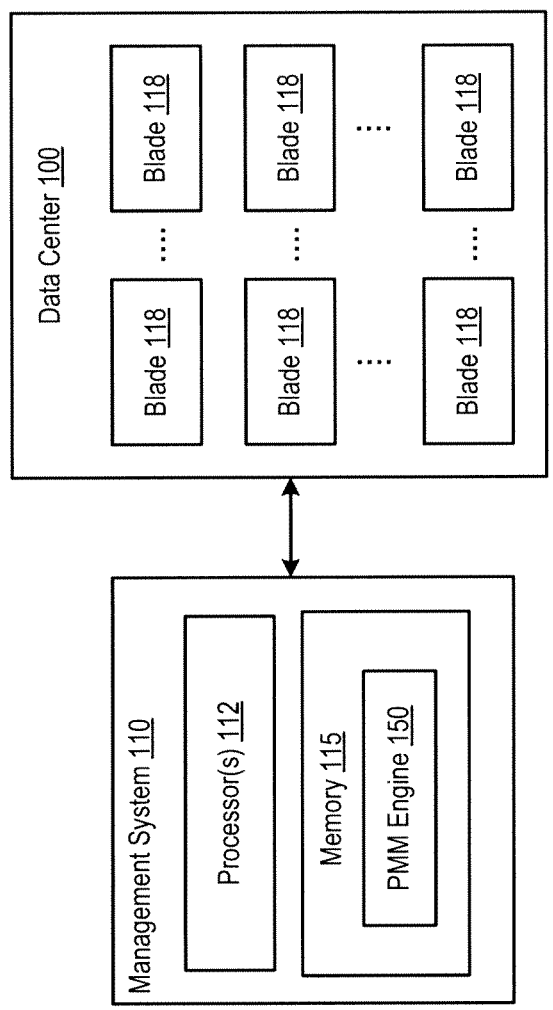
FIG. 1 illustrates an example of an environment in which an embodiment of the invention may operate.

Embodiments of the invention provide a power management and data center resource monitoring mechanism for selecting new processing elements in a data center. As a result, power consumption in the data center can be reduced and hardware life can be extended.

In one embodiment, a method of selecting the new processing elements is described. The method comprises detecting a condition for selecting new processing elements; selecting one or more processing elements as the new processing elements based on at least a temperature parameter and a usage history parameter of at least some of the processing elements; and consolidating workload onto the new processing elements.

In another embodiment, a power management and monitoring system that performs the selection of the new processing elements is described. The system comprises one or more processors, a hotspot regulator and an optimizer. The hotspot regulator is adapted to detect a condition for selecting new processing elements. The optimizer is adapted to select one or more processing elements as the new processing elements based on at least a temperature parameter and a usage history parameter of at least some of the plurality of processing elements; and to consolidate workload onto the new processing elements.

DESCRIPTION OF EMBODIMENTS

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Moreover, the term "blade" as used herein indicates a stripped-down server computer with a modular design optimized to minimize the use of physical space and energy. Nevertheless, it is understood that in the following description, the terms "blade" and "server" may be used interchangeably to mean a processing element having any form factor and any processing capabilities.

A power management and monitoring (PMM) mechanism for a data center is described herein. The PMM mechanism conserves energy usage by preventing or reducing the formation of hotspots in the data center. A hotspot is an indication of high temperature in a cluster of processing elements relative to the surrounding processing elements, or an indication of high traffic or usage in a cluster of processing elements relative to the surrounding processing elements. The PMM mechanism selects blades throughout the data center to be activated to support the current workload. These activated (or equivalently, "active") blades are distributed throughout the data center to even out the temperature distribution in the data center. In a data center with an uneven temperature distribution, the cooling system may try to cool down the entire data center such that high-temperature locations are cooled to an optimal temperature, causing the lower-temperature locations in the data center being cooled to a temperature cooler than necessary. A data center with an even temperature distribution can reduce the amount of cooling and thereby conserve energy and reduce cooling costs.

In one embodiment, the number of the selected blades is chosen such that each blade will be within a target range of utilization. At low-load times of the day (e.g., at night), under-utilized blades can be consolidated into fewer numbers of active blades, such that the unused blades can be de-activated to reduce power consumption of the blades.

The PMM mechanism can also extend hardware life. The PMM mechanism takes into account blade usage history when selecting the blades. The usage history for each blade may include when the blade was made (i.e., age), how many hours the blade has been active, and the expected lifespan of the blade. Other factors relating to the usage history may also be considered. The PMM mechanism equalizes the use of the blades over time such that the lifespan of all of the blades in the data center can be extended at least up to their respective mean time to failure ratings.

In one embodiment, the PMM mechanism may be implemented as a component of a cloud management system. The PMM mechanism monitors data center power usage, reports hotspots and presents analytical data illustrating data center hotspots over specified periods of time. The PMM mechanism can also configure the distribution and randomization of traffic within the data center infrastructure.

FIG. 1 is a diagram illustrating an environment in which an embodiment of the invention may operate. In this embodiment, a data center 100 includes a collection of blades 118. The data center 100 may be a telecommunication data center, an information technology data center, a cloud computing data center, or any data center that hosts a large number of processing elements such as the blades 118. The blades 118 may be coupled to each other via a network within the data center 100, and may be coupled to external network nodes via an external network (e.g., a proprietary or public wide area network). In one embodiment, the data center 100 may be coupled to a management system 110 that monitors and manages the operations of the data center 100. The management system 110 may be co-located with the data center 100, within the data center 100 or remotely coupled to the data center 100. The management system 110 may monitor hardware usage, generate and report alarms, setup accounts, and perform other management functions. In one embodiment, the management system 110 includes one or more processors 112 for performing the management functions, and a memory 115 for storing code and data relating to the management functions. In one embodiment, the management system 110 includes a power management and monitoring (PMM) engine 150 for managing and monitoring power consumption in the data center 100. The PMM engine 150 may be implemented by hardware, software, firmware, or a combination of any of the above.

Figure 2B:
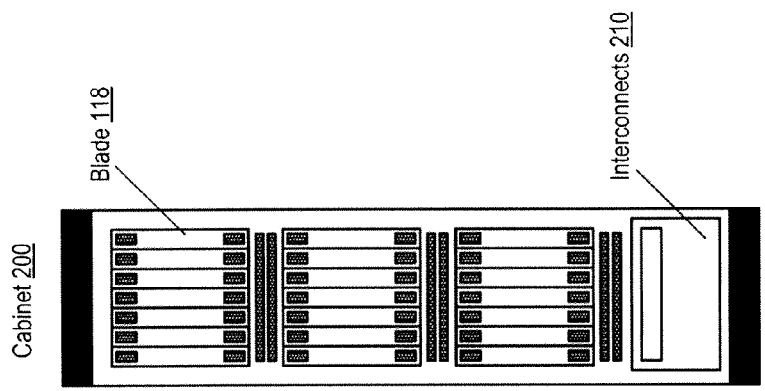
FIG. 2B illustrates an example of a cabinet of blades according to one embodiment.
Figure 2A:
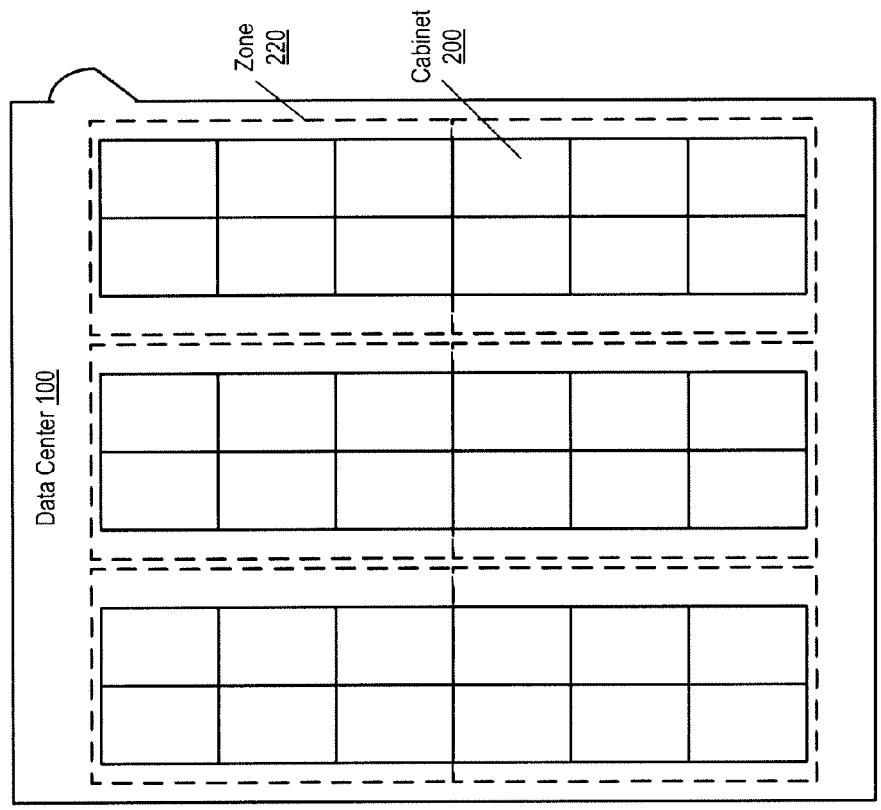
FIG. 2A illustrates an example of a data center according to one embodiment.

FIG. 2A illustrates a data center floor space as view from the top according to one embodiment. The floor space of the data center is divided into multiple zones 220. Larger data centers may have more zones 220 than smaller data centers. Within each zone 220 there are one or more cabinets 200 of blades. In one embodiment, the cabinets 200 may be arranged in in multiple rows. In the embodiment shown in FIG. 2A, two adjacent rows may be arranged back-to-back, and the front sides of the rows may face an aisle. FIG. 2B illustrates an example of the cabinet 200 according to one embodiment. In this example, the cabinet 200 has multiple levels, each level has multiple blades 118 stacked side by side. The lowest level of the cabinet 200 houses interconnects 210 for connecting the blades 118 within the cabinet 200 to one another and to the other blades 118 in the data center. The blades 118 with similar usage history may be located within the same zones 220, same cabinets 200, or same levels of a cabinet 200; or may be distributed across different zones 220, different cabinets 200, or different levels of a cabinet 200. It is understood that the embodiments shown and described herein are examples and not limiting. The blades 118 and cabinets 200 may be arranged in any physical configuration as appropriate for the data center 100.

During operation of the data center 100, hotspots may be formed within one or more zones 220, one or more cabinets 200, and/or one or more levels of a cabinet 200. In addition, some blades 118 may have been active for an extended amount of time while some other blades may have been idle for an extended amount of time. The active blades may be running multiple VMs simultaneously. The management system 110 of FIG. 1 monitors the data center resources, such as processing elements (i.e., blades/servers, power supplies, network fabric, cabinets, cooling, etc. Using the information gathered from the monitoring, the management system 110 tracks and maintains the current status of each active blade, including but not limited to temperature, traffic load, CPU utilization, etc. Additionally, the management system 110 also tracks and maintains the usage history of all of the blades in the data center. In one embodiment, the PMM engine 150 periodically checks the current status of the active blades to determine whether to optimize the pool of active blades for hosting the VMs.

In the following description, the term "VMs" is used because it is assumed that the blades provide processing power in a virtualized environment. Thus, the workload on a blade is executed by one or more VMs hosted by the blade. Nevertheless, it is appreciated that the blades may operate in a non-virtualized environment where workload of the data center is executed directly by one or more of the blades without a virtualization layer. Thus, the term "workload" as used herein applies to data processing in virtualization scenarios as well as in the non-virtualized scenarios.

Figure 3:
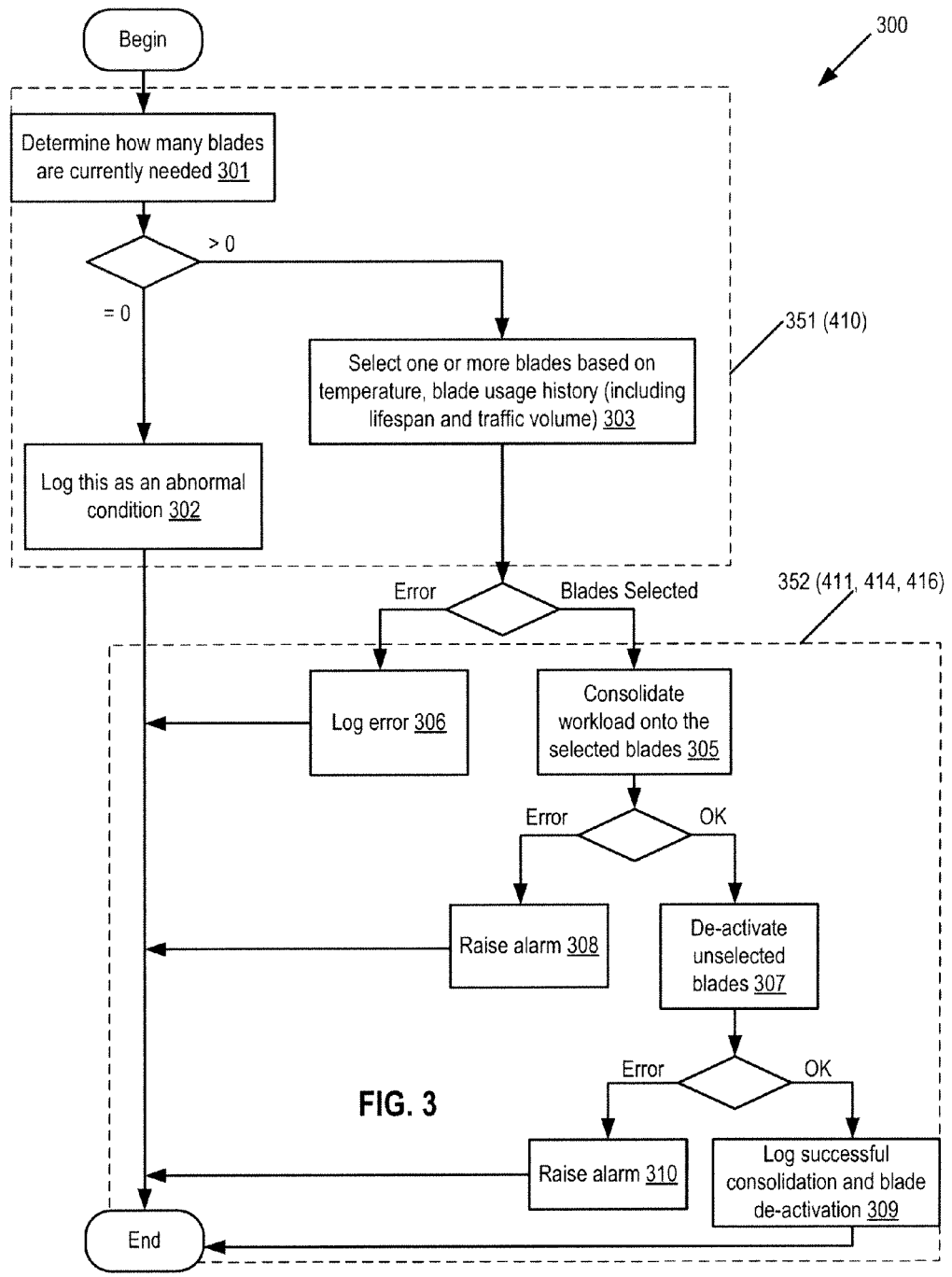
FIG. 3 is a flow diagram illustrating a method of selecting new blades according to one embodiment.

FIG. 3 illustrates a flow diagram of a method 300 for selecting new processing elements (e.g., blades) in a data center that implements power management and monitoring of data center resources according to one embodiment. In one embodiment, the method 300 may be performed by the PMM engine 150 of FIG. 1, which may be implemented by hardware, firmware, or software that is stored in the memory 115 or other computer-readable medium and executed by the one or more processors 112. In one embodiment, in response to a determination that it is time to optimize the pool of active blades for hosting the currently active VMs, the PMM engine 150 first determines the number of blades that is needed for the VMs (301). The determined number of blades will be used to support the currently active VMs, such that the utilization of each blade falls into a predetermined target range (e.g., 30-70% or another predetermined range measured in another metric). If the determined number of blades is zero, the PMM engine 150 logs this condition as abnormal (302). If the determined number of blades is greater than zero, as in the typical case of an operating data center, the PMM engine 150 selects one or more blades based on one or more parameters, including at least a temperature parameter and a usage history parameter (303). Additional parameters such as blade lifespan, traffic load, and the like, may also be considered. In one embodiment, the one or more blades being selected satisfy a selection criterion that incorporates at least the temperature parameter and the usage history parameter. In one embodiment, the temperature parameter may include one or more of the following: an estimated temperature of each blade based on the traffic load of the blade, an ambient temperature measurement of one or more of the zones, a temperature measurement of each blade, and the expected heat distribution in the data center when the newly selected blades are in operation. The expected heat distribution is used to prevent the selected blades from forming one or a few closely-spaced clusters, which may become hotspots during operation. The usage history parameter of each blade may include one or more of the following: an age of the blade, and a length of time for which the blade has been active.

In one scenario, the number of blades determined at 301 may be less than the number of blades that satisfy the selection criterion. In this scenario, the blades that satisfy the selection criterion are referred to as a list of candidate blades, and the list may also be referred to as a candidate list. PMM engine 150 may randomly select blades from the candidate list, such that the number of these randomly selected blades equals the number of the determined number at 301. Alternatively, the PMM engine 150 may select the determined number of blades based on a predetermined formula or criterion.

In one scenario, the candidate list may include some of the currently active blades; that is, the blades that are currently hosting the currently active VMs. These active blades in the candidate list may be given priority over the other blades in the data center for continuing active usage to avoid the cost of migrating the VMs. Thus, in one embodiment, the PMM engine 150 may select from the candidate list one or more of the active blades prior to selecting additional blades. If the number of the active blades in the candidate list is more than the determined number of blades, some of those active blades can be de-activated and their VMs can be migrated to the remaining active blades.

The term "de-activation" as used herein refers to the action of removing a blade from active usage. Thus, a de-activated blade may be in an idle state or a sleep state, or may be completely powered-off. The choice between these different states may depend on what is supported by the hardware and whatever is most energy efficient for that particular hardware and the predicted usage patterns.

After the blades are selected at 303, the PMM engine 150 consolidates workload; e.g., the currently active VMs, onto the selected blades (305). The PMM engine 150 then sends a request to de-activate the unselected blades (307). In one embodiment the request may be sent to a power control unit in a management system (e.g., the management system 110 of FIG. 1). The PMM engine 150 logs the successful consolidation and blade de-activation (309). If an error occurs in the process of selecting blades, consolidating workload, or de-activating blades, the PMM engine 150 logs the error and/or raises an alarm (306,308 and 310).

Figure 4:
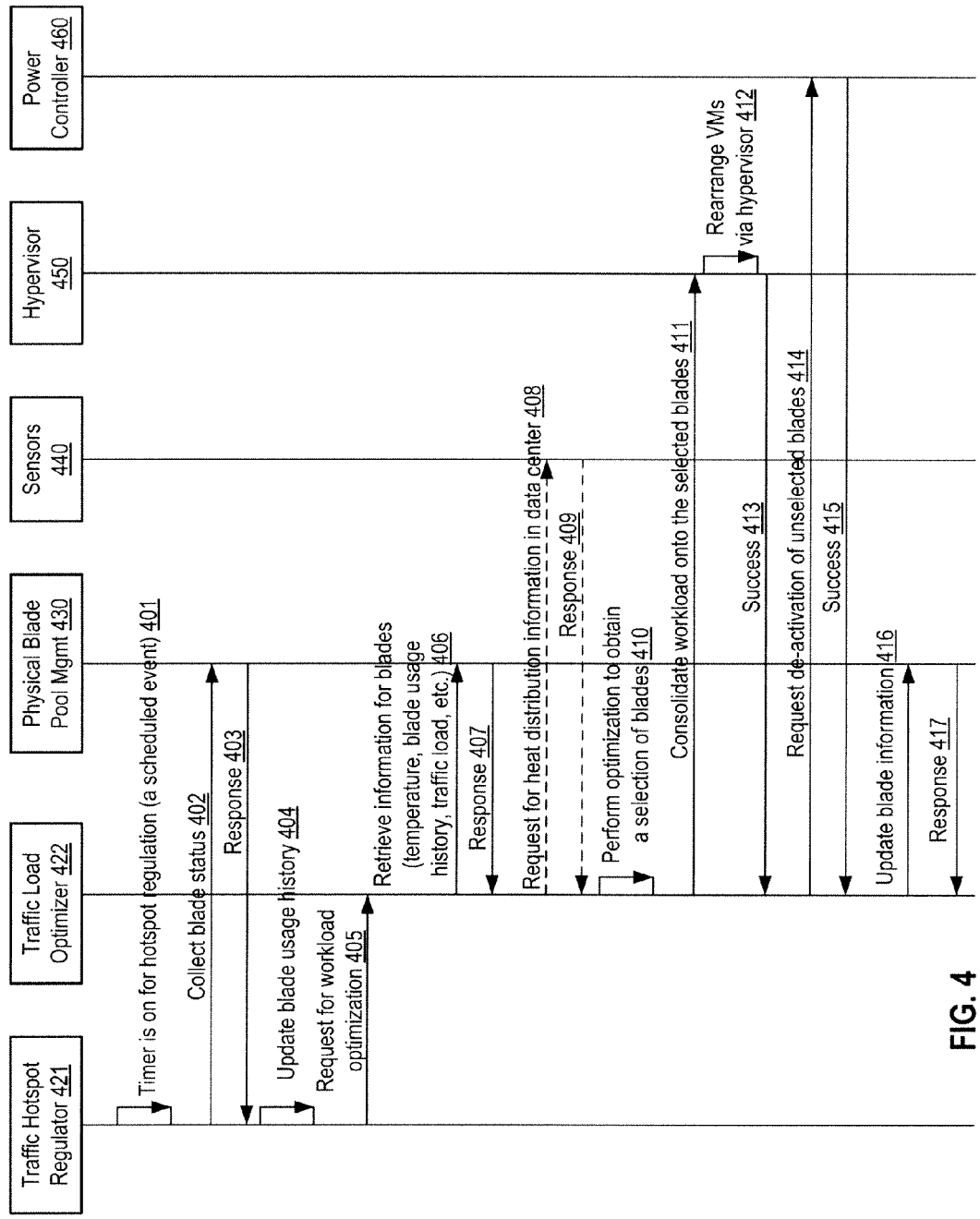
FIG. 4 is a messaging diagram illustrating message exchanges for selecting new blades according to one embodiment.

FIG. 4 illustrates a messaging diagram among management components of a data center for selecting new processing elements (e.g., blades) to be activated according to one embodiment. In this embodiment, the management components include a traffic hotspot regulator 421 ("hotspot regulator" or "regulator") and a traffic load optimizer 422 ("optimizer"), both of which may be part of the PMM engine 150 of FIG. 1. The regulator 421 and the optimizer 422 are in communication with a physical blade pool management 430, one or more sensors 440, a hypervisor 450 and a power controller 460. The physical blade pool management 430 keeps track of the current status of each active blade, such as the blade's internal temperature (based on the measurement made by an internal sensor of the blade), traffic load, utilization, and the like. For inactive or idle blades, the physical blade pool management 430 may record their temperatures, traffic load, and utilization as zero or a negligible value. Additionally, for each blade in the data center, the physical blade pool management 430 also keeps track its usage history (e.g., the blade's age and how many hours it has been active), expected lifespan, and whether the blade is currently active, idle, sleeping, or shut down. In an embodiment where the internal temperature of the blade is not available to the physical blade pool management 430, the blade's internal temperature may be estimated by the traffic load of the blade. Each active blade may host a number of VMs, which are managed by the hypervisor 450. The hypervisor 450 is responsible of creating new VMs, shutting down VMs, and migrating VMs from one blade to another. The hypervisor 450 runs on a blade to provide a virtualized operating environment. In a non-virtualized environment, the hypervisor 450 may be replaced by the operating system or another system-level utility that runs on the blade. The power controller 460 is responsible for powering on and off each blade in the data center, as well as placing each blade in a power saving state such as an idle state or a sleep state. In one embodiment, the physical blade pool management 430, the hypervisor 450 and a power controller 460 may be part of the management system 110 of FIG. 1. In one embodiment, the one or more sensors 440 may be deployed in the data center to collect data center environmental measurements. An example of the sensor 440 is a thermometer that is deployed in the data center to measure the ambient temperature in one or more zones of the data center.

In one embodiment, the regulator 421 maintains a timer for hotspot regulation. The timer may expire (i.e., be "on") periodically; e.g., daily, every 12 hours, or according to a predetermined schedule. When the timer expires, the regulator 421 sends a request to the physical blade pool management 430 for the current status of the active blades (402). Based on the blade status indicated in the response from the physical blade pool management 430 (403), the regulator 421 determines whether the distribution of workload (e.g., currently active processing elements and VMs) should be optimized. The regulator 421 also updates a local copy of the blade usage history (404).

In one embodiment, the physical blade pool management 430 assigns a numerical or color-coded status indicator to each active blade according to a criterion that is based on the blade information maintained by the physical blade pool management 430. The status indicator of a blade may be determined based on the blade's temperature and/or usage when compared with a critical threshold. The term "critical threshold" as used herein refers to a threshold of time (which is used as a metric of the blade's usage or usage history), or a threshold of temperature or traffic load (which is used as a metric of the blade's temperature).

For example, a "red" status indicator may mean that the blade has exceeded a critical threshold; for example, the blade has been active with high traffic load for a period of time exceeding a time threshold, the blade has been active with a traffic load exceeding a load threshold for a period of time, or the blade's temperature and/or usage history indicates that it is highly recommended that the blade be de-activated as soon as possible. A "yellow" status indicator may mean that the blade is expected to exceed a critical threshold within a pre-determined period of time. The "expectation" may be based on a predetermined threshold that is below but "close to" a critical threshold (e.g., 80%-90% of the critical threshold) or may be based on trending (e.g., patterns of usage, temperature or traffic that indicate a blade's usage/temperature is approaching a critical threshold); for example, the blade has been active with high traffic load for a period of time that is equal to 80% of a time threshold, the blade has been active with a traffic load that is equal to 90% of a load threshold for a period of time, or the blade's temperature and/or usage history indicates that it is recommended that the blade be de-activated if possible. A "green" status indicator may mean that the blade is running with a safe margin from a critical threshold and may continue to be active. In some embodiments, all of the inactive blades in the data center may be assigned a "green" status indicator. A "blue" status indicator may mean that the blade is under-utilized for a length of time. Alternatively, the physical blade pool management 430 may use a criterion that assigns the status indicator based on a combination of the blade's temperature and usage history different from the description above. The criterion used by the physical blade pool management 430 also defines the "critical threshold," "time threshold," "load threshold," and "under-utilized." In one embodiment, the regulator 421 may determine to optimize the distribution of the workload based on the number of blades that have red, yellow and/or blue status. In one embodiment, the regulator 421 may determine to optimize the distribution of the workload when the number of currently active blades that exceed or are expected to exceed a critical threshold is greater than a predetermined number. In one embodiment, the regulator 421 may determine to optimize the distribution of the workload when the number of under-utilized blades is greater than a predetermined number.

If the regulator 421 based on the status of the active blades determines that the distribution of the workload should be optimized, it sends a request to the optimizer 422 for workload optimization. The optimizer 422 retrieves information about the data center resources, such as blades, power supplies, network fabric for connecting the blades, cabinets for housing the blades, cooling, etc., from the blade pool management 430 and other data center monitoring sensors and/or devices. More specifically, the optimizer 422 retrieves the information of all of the blades in the data center from the physical blade pool management 430 (406), where the retrieved information in the response (407) includes blade temperature, blade usage history, expected lifespan, traffic load, etc. In some embodiments, the optimizer 422 also sends requests to the sensors 440 (e.g., thermometers) for current heat distribution information (e.g., ambient temperature in the data center) (408), and receives the requested information if such information is available (409). The optimizer 422 then performs workload optimization to select the new active blades (410). In one embodiment, the optimizer 422 performs the optimization by executing block 351 of the method 300 shown in FIG. 3. After the blades are selected, the optimizer 422 then requests the hypervisor 450 (in a virtualization scenario) to consolidate the currently active VMs onto the selected blades (411); e.g., by migrating the VMs from an unselected blade to a selected blade. The hypervisor 450 re-arranges the VMs in response to the request (412). After receiving an indication of success from the hypervisor 450 (413), the optimizer 422 requests the power controller 460 to de-activate the unused blades (414). Upon receiving an indication of success from the power controller 460 (415), the optimizer 422 sends the updated blade information to the physical blade pool management 430 (416) and receives a response (417). In one embodiment, the optimizer 422 performs workload consolidation and requests blade de-activation by executing block 352 of the method 300 shown in FIG. 3.

Figure 5:
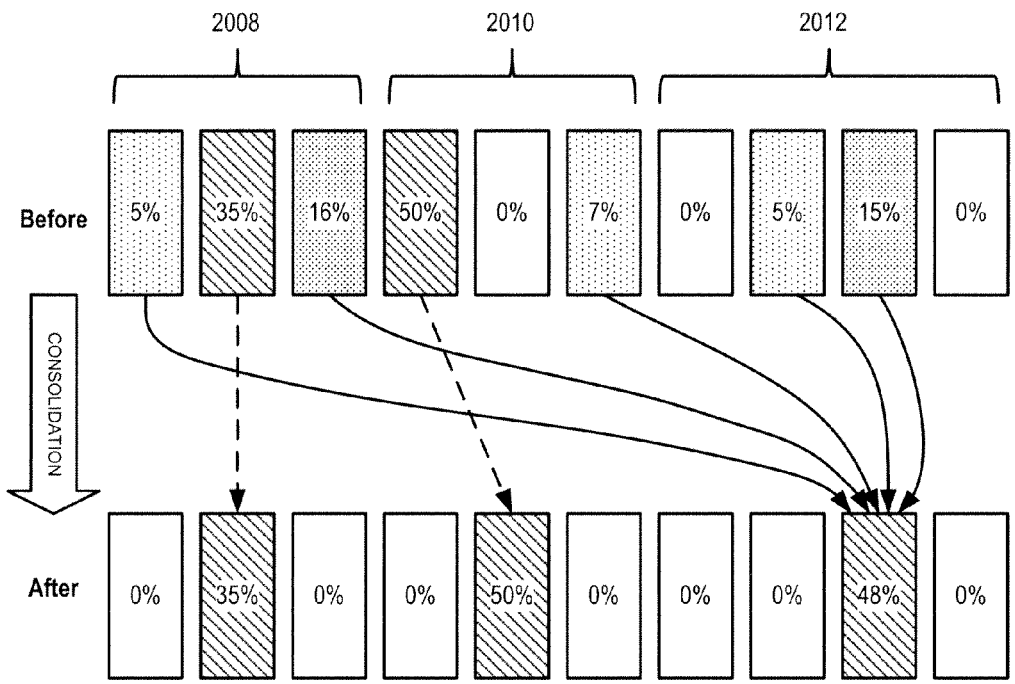
FIG. 5 illustrates an example of consolidation of workload onto selected blades according to one embodiment.

An example of blade selection and consolidation is shown in FIG. 5 according to one embodiment. This example shows a collection of ten blades (in the top row), three of which were made in year 2008, another three of which were made in year 2010, and the remaining four of which were made in year 2012. Assume that the target range of utilization for the blades is 30%-70%. Thus, five of the blades are running below this target range and therefore an optimization of VM distribution will be performed according to the diagrams of FIG. 3 and FIG. 4. The result of the optimization is shown in the bottom row, where only three blades are selected to be active and all of the workload is consolidated onto the three blades. The consolidated utilization of each of the three blades falls into the target range of 30%-70%. As the selection is based on the usage history parameter (as described in the diagrams of FIG. 3 and FIG. 4), the blades' age (that is, when the blade was made) is used as a selection factor. Further, as the blades are selected based on the temperature parameter (that includes the expected heat distribution when the selected blades are put into operation), the selected three blades are spaced apart, which helps heat dissipation and cooling.

Figure 6:
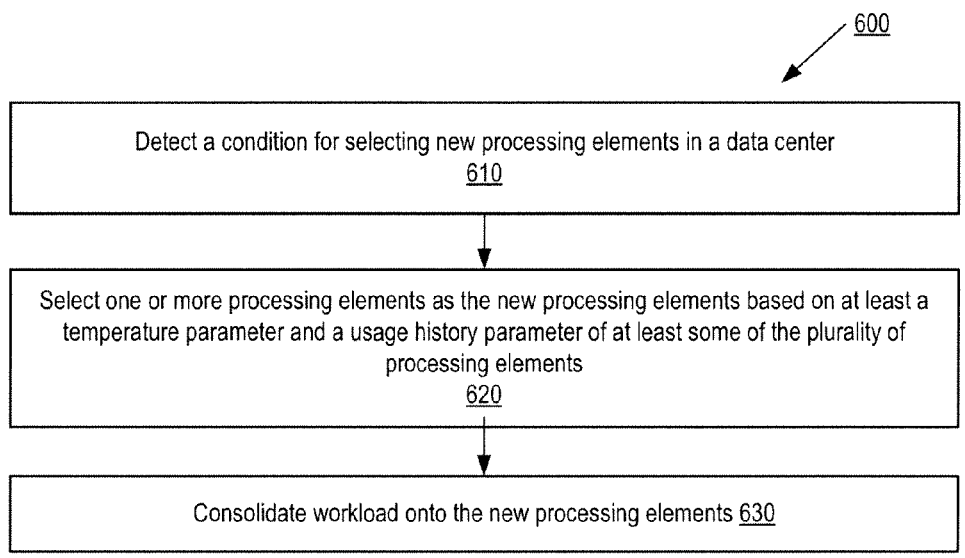
FIG. 6 is another flow diagram illustrating a method of selecting new processing elements according to one embodiment.

FIG. 6 illustrates a method 600 of selecting new processing elements (e.g., blades) to be activated in a data center that implements power management and monitoring of data center resources that implements power management and monitoring of data center resources according to one embodiment. The method 600 may be performed by the PMM engine 150 of FIG. 1; or more specifically, the regulator 421 and optimizer 422 of FIG. 4. As mentioned above, the PMM engine 150 (including the regulator 421 and optimizer 422) may be implemented by hardware, firmware, or software that is stored in the memory 115 or other computer-readable medium and executed by the one or more processors 112 of FIG. 1.

In one embodiment, the method 600 selects new processing elements for cloud computing in a data center to reduce power consumption and extend hardware life in the data center.

In one embodiment, the method 600 comprises: detecting a condition for selecting new processing elements (610); selecting one or more processing elements as the new processing elements based on at least a temperature parameter and a usage history parameter of at least some of the processing elements in the data center (620); and consolidating workload onto the new processing elements (630).

The operations of the diagrams of FIGS. 3 and 6 have been described with reference to the exemplary embodiment of FIGS. 1 and 4. However, it should be understood that the operations of the diagrams of FIGS. 3 and 6 can be performed by embodiments of the invention other than those discussed with reference to FIGS. 1 and 4, and the embodiment discussed with reference to FIGS. 1 and 4 can perform operations different from those discussed with reference to the diagrams of FIGS. 3 and 6. While the diagrams of FIGS. 3 and 6 shows a particular order of operations performed by certain embodiments of the invention, it should be understood that such order is exemplary (e.g., alternative embodiments may perform the operations in a different order, combine certain operations, overlap certain operations, etc.).

Different embodiments of the invention may be implemented using different combinations of software, firmware, and/or hardware. Thus, the techniques shown in the figures can be implemented using code and data stored and executed on one or more electronic devices (e.g., computers, servers, blades, etc.). Such electronic devices store and transmit (internally and/or with other electronic devices over a network) code (composed of software instructions) and data using computer-readable media, such as non-transitory tangible computer-readable media (e.g., computer-readable storage media such as magnetic disks; optical disks; read only memory; flash memory devices) and transitory computer-readable transmission media (e.g., electrical, optical, acoustical or other form of propagated signals—such as carrier waves, infrared signals). In addition, such electronic devices typically include a set of one or more processors coupled to one or more other components, such as one or more non-transitory machine-readable media (to store code and/or data), user input/output devices (e.g., a keyboard, a touchscreen, and/or a display), and network connections (to transmit code and/or data using propagating signals). The coupling of the set of processors and other components is typically through one or more busses and bridges (also termed as bus controllers). Thus, a non-transitory computer-readable medium of a given electronic device typically stores instructions for execution on one or more processors of that electronic device. One or more parts of an embodiment of the invention may be implemented using different combinations of software, firmware, and/or hardware.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method of providing power management and monitoring of data center resources in a data center that comprises a plurality of processing elements, the method optimizes heat distribution and utilization of the processing elements, the method comprising the steps of:
    detecting, by a management system of the data center, a condition for selecting new processing elements;
    selecting one or more processing elements as the new processing elements based on a combination of at least a temperature parameter and a usage history parameter of at least some of the plurality of processing elements, wherein the usage history parameter of each of the plurality of processing elements comprises one or more of the following: an age of the processing element and a length of time for which the processing element has been active; and
    consolidating workload onto the new processing elements.

2. The method of claim 1, wherein the temperature parameter comprises one or more of the following: an estimated temperature of each of the plurality of processing elements based on traffic load of the processing element, an ambient temperature measurement of one or more of the zones, a temperature measurement of each of the plurality of processing elements, and expected heat distribution in the data center when the new processing elements are in operation.

3. The method of claim 1, wherein the step of selecting further comprises the step of determining a total number of the new processing elements to be selected such that utilization of each of the new processing elements falls within a target range.

4. The method of claim 1, wherein the step of selecting further comprises the steps of:
    determining a list of candidate processing elements based on at least the temperature parameter and the usage history parameter; and
    selecting at random, or based on a predetermined formula or criterion, the one or more processing elements from the list of candidate processing elements as the new processing elements.

5. The method of claim 1, wherein the step of selecting further comprises the step of selecting one or more of the new processing elements from currently active processing elements.

6. The method of claim 1, wherein the workload comprises currently active virtual machines.

7. The method of claim 1, further comprising the step of requesting de-activation of unselected ones of the plurality of processing elements.

8. The method of claim 1, wherein the step of detecting further comprises one or more of the following: detecting whether a number of currently active processing elements in the data center that exceed or are expected to exceed a critical threshold is greater than a first predetermined number, and detecting whether a number of under-utilized processing elements in the data center is greater than a second predetermined number.

9. The method of claim 1, further comprising monitoring the data center resources in the data center, wherein the data center resources comprise one or more of the following: the plurality of processing elements, power supplies, network fabric connecting the plurality of processing elements, cabinets for housing the plurality of processing elements and cooling.

10. A system that provides power management and monitoring of data center resources in a data center that comprises a plurality of processing elements, the system optimizes heat distribution and utilization of the processing elements, the system comprising:
    one or more processors;
    a hotspot regulator coupled to the one or more processors, the hotspot regulator adapted to detect a condition for selecting new processing elements; and
    an optimizer coupled to the hotspot regulator, the optimizer adapted to:
    select one or more processing elements as the new processing elements based on a combination of at least a temperature parameter and a usage history parameter of at least some of the plurality of processing elements, wherein the usage history parameter of each of the plurality of processing elements comprises one or more of the following: an age of the processing element and a length of time for which the processing element has been active; and
    consolidate workload onto the new processing elements.

11. The system of claim 10, wherein the temperature parameter comprises one or more of the following: an estimated temperature of each of the plurality of processing elements based on traffic load of the processing element, an ambient temperature measurement of one or more of the zones, a temperature measurement of each of the plurality of processing elements, and expected heat distribution in the data center when the new processing elements are in operation.

12. The system of claim 10, further comprising a physical blade pool management coupled to the hotspot regulator and the optimizer, the physical blade pool management adapted to track and provide a current status of a currently active processing element in the data center, wherein the current status indicates whether the currently active processing element exceeds or is expected to exceed a critical threshold.

13. The system of claim 10, wherein the optimizer is further adapted to determine a total number of the new processing elements to be selected such that utilization of each of the new processing elements falls within a target range.

14. The system of claim 10, wherein the optimizer is further adapted to determine a list of candidate processing elements based on at least the temperature parameter and the usage history parameter, and to select at random, or based on a predetermined formula or criterion, the one or more processing elements from the list of candidate processing elements as the new processing elements.

15. The system of claim 10, wherein the optimizer is further adapted to select one or more of the new processing elements from currently active processing elements.

16. The system of claim 10, wherein the workload comprises currently active virtual machines.

17. The system of claim 10, wherein the optimizer is further adapted to request de-activation of unselected ones of the plurality of processing elements.

18. The system of claim 10, wherein the hotspot regulator is further adapted to detect one or more of the following: whether a number of currently active processing elements in the data center that exceed or are expected to exceed a critical threshold is greater than a predetermined number, and to detect whether a number of under-utilized processing elements in the data center is greater than a predetermined number.

19. The system of claim 10, wherein the optimizer is further adapted to retrieve information gathered from monitoring the data center resources, wherein the data center resources comprise one or more of the following: the plurality of processing elements, power supplies, network fabric connecting the plurality of processing elements, cabinets for housing the plurality of processing elements and cooling.

* * * * *